United States Patent
Ma

(10) Patent No.: US 11,139,319 B2
(45) Date of Patent: Oct. 5, 2021

(54) ARRAY SUBSTRATE AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Weixin Ma, Wuhan (CN)

( * ) Notice: Subject to any disclaimer, the term of this patent is extended or adjusted under 35 U.S.C. 154(b) by 349 days.

(21) Appl. No.: 16/326,934

(22) PCT Filed: Nov. 5, 2018

(86) PCT No.: PCT/CN2018/113981
§ 371 (c)(1),
(2) Date: Feb. 21, 2019

(87) PCT Pub. No.: WO2020/073395
PCT Pub. Date: Apr. 16, 2020

(65) Prior Publication Data
US 2021/0183892 A1    Jun. 17, 2021

(30) Foreign Application Priority Data

Oct. 8, 2018   (CN) .......................... 201811168383.8

(51) Int. Cl.
*H01L 27/00* (2006.01)
*H01L 27/12* (2006.01)

(52) U.S. Cl.
CPC ........ *H01L 27/124* (2013.01); *H01L 27/1248* (2013.01)

(58) Field of Classification Search
CPC ............... H01L 27/124; H01L 27/1248; H01L 27/3276; H01L 27/3244; H01L 27/0802
See application file for complete search history.

(56) References Cited

U.S. PATENT DOCUMENTS

| 6,084,579 | A | * | 7/2000 | Hirano | G09G 3/3216 315/169.3 |
| 6,351,078 | B1 | * | 2/2002 | Wang | G09G 3/3233 313/498 |
| 8,300,031 | B2 | * | 10/2012 | Kimura | G09G 3/3233 345/204 |

(Continued)

FOREIGN PATENT DOCUMENTS

| CN | 102315211 A | 1/2012 |
| CN | 104793800 A | 7/2015 |
| CN | 107870488 A | 4/2018 |

*Primary Examiner* — Nikolay K Yushin

(57) ABSTRACT

An array substrate and a display device are provided. The array substrate is provided with a display area and a non-display area, and the array substrate further includes a plurality of thin film transistors, a driving circuit, a plurality of polysilicon resistors, and a plurality of fan-out wires. The thin film transistor array is arranged in the display area, and each thin film transistor is provided with an input end. The driving circuit corresponds to the non-display area, and the driving circuit is provided with an output end. The polysilicon resistors and the fanout wires correspond to the non-display area. Two ends of each polysilicon resistor are respectively connected to the input end of a corresponding thin film transistor and the output end of the driving circuit through a corresponding fanout wire.

9 Claims, 2 Drawing Sheets

(56) References Cited

U.S. PATENT DOCUMENTS

| | | | |
|---|---|---|---|
| 8,933,344 B2* | 1/2015 | Jeon | G02F 1/1345 |
| | | | 174/260 |
| 2002/0153568 A1 | 10/2002 | Takasu | |
| 2013/0242449 A1 | 9/2013 | Kato et al. | |
| 2014/0098495 A1* | 4/2014 | Jeon | H05K 7/20136 |
| | | | 361/695 |
| 2017/0115797 A1 | 4/2017 | Zheng et al. | |

* cited by examiner

ARRAY SUBSTRATE AND DISPLAY DEVICE

FIELD OF INVENTION

The present invention relates to the field of display, and in particular to an array substrate and a display device.

BACKGROUND OF INVENTION

With the rapid development of technology, people are increasingly relying on information exchange and delivery. As the main carrier and foundation for information exchange and delivery, display devices have become the hotspots and highlands that many scientists in the fields of information and optoelectronics are competing for.

The advent of AMOLED (active matrix organic light emitting diode) is a big breakthrough in the field of display technology. Due to its self-illumination principle, there is no need for backlights, color filters, and other components. AMOLED is lighter and thinner than LCD (liquid crystal display), consumes less energy and is less susceptible to damage than a glass substrate because of its flexibility.

In AMOLED, the driving circuit transmits signals to the display area through the fan-out wire on the array substrate. However, as the display effect of display device is getting better and better, the driving circuit outputs more and more signals, and more and more fanout wires are required. In order to ensure the uniformity of the display effect, all the fan-out wires from the driving circuit to the display area must have the same electrical resistance. In the prior art, the electrical resistance of all fan-out wires is kept consistent by winding the wires. The magnitude of the electrical resistance is changed by changing the length of the curved winding of the fan-out wire to achieve the purpose that the electrical resistance of each fan-out wire is substantially uniform. This method not only wastes material and space but also easily causes the interlayer dielectric layer overlaying the curved wire to easily rupture because a curvature of the edge of the inner side of the curved wire is relatively large. As a result, a short circuit occurs between the fan-out wire and the source and drain electrodes on the interlayer dielectric layer, which greatly reduces the service life of the product.

Technical Problem

An object of the present invention is to provide an array substrate and a display device to solve the problems of wasting materials, high cost and short service life existed in the prior art.

Technical Solution

In order to achieve the above object, the present invention provides an array substrate provided with a display area and a non-display area, and the array substrate further includes a plurality of thin film transistors, a driving circuit, a plurality of polysilicon resistors, and a plurality of fan-out wires. The thin film transistor array is arranged in the display area, and the thin film transistor has an input end. The driving circuit corresponds to the non-display area, and the driving circuit has an output end. The polysilicon resistor and the fanout wire correspond to the non-display area. The two ends of each polysilicon resistor are respectively connected to an input end of the thin film transistor and an output end of the driving circuit through the corresponding fan-out wires.

Further, the fan-out wires include a plurality of first scan wires and a plurality of second scan wires. The array substrate further includes a buffer layer, a first insulating layer, a second insulating layer and an interlayer dielectric layer. The polysilicon resistors are disposed on the buffer layer. The first insulating layer covering the polysilicon resistor, the first scan wires are disposed on the first insulating layer. The second insulating layer covering the first scan wire, the second scan wires are disposed on the second insulating layer. The interlayer dielectric layer covering the second scan wires.

Further, the material of the interlayer dielectric layer is an insulating dielectric material.

Further, the array substrate further includes a source circuit and a drain circuit disposed on the interlayer dielectric layer.

Further, one end of each polysilicon resistor is provided with a first tandem hole, and the other end is provided with a second tandem hole. Each of the first scan wires is provided with a first connection end and a second connection end. Each of the second scan wires is provided with a third connection end and a fourth connection end. When the polysilicon resistor is connected to a corresponding first scan wire, the first tandem hole is connected to the first connection end, and the second tandem hole is connected to the second connection end. When the polysilicon resistor is connected to the corresponding first scan wire, the first tandem hole is connected to the third connection end through the source circuit, and the second tandem hole is connected to the fourth connection end through the drain circuit.

Further, the first insulating layer is provided with a plurality of first through holes. Each of the first through holes corresponds to the first tandem hole or the second tandem hole in respect to a vertical direction.

Further, the second insulating layer is provided with a plurality of second through holes. Each of the second through holes corresponds to the first tandem hole or the second tandem hole in respect to the vertical direction.

Further, the interlayer dielectric layer is provided with a plurality of third through holes. Each of the third through holes corresponds to the second through hole or the third connecting end or the fourth connecting end in respect to the vertical direction.

Further, a total number of the first through holes and a total number of the third through holes each are twice as a total number of the second through holes.

The invention further provides a display device including the array substrate.

In the present invention, an array substrate and a display device are provided. The resistance of each fan-out wire is kept constant by connecting polysilicon resistors in series, and the magnitude of the resistance can be adjusted by changing the length and size of the polysilicon.

Beneficial Effect

In the present invention, an array substrate and a display device are provided. The resistance of each fan-out wire is kept uniform by connecting polysilicon resistors in series, and the magnitude of the resistance can be adjusted by changing the length and size of the polysilicon. In this way, the resistance is kept substantially consistent and it does not cause breakage of the interlayer dielectric layer, therefore, it also does not cause a short circuit between the fan-out wire and the source and drain electrodes on the interlayer dielectric layer, thereby improving the service life of the product.

The way of eliminating the windings renders the structure simpler, saves raw materials and reduces costs.

DESCRIPTION OF DRAWINGS

In order to more clearly illustrate the technical solutions in the embodiments of the present invention, the following figures described in the embodiments will be briefly introduced. It is obvious that the drawings described below are merely some embodiments of the present invention, other drawings can also be obtained by the person ordinary skilled in the field based on these drawings without doing any creative activity.

Figure 1:
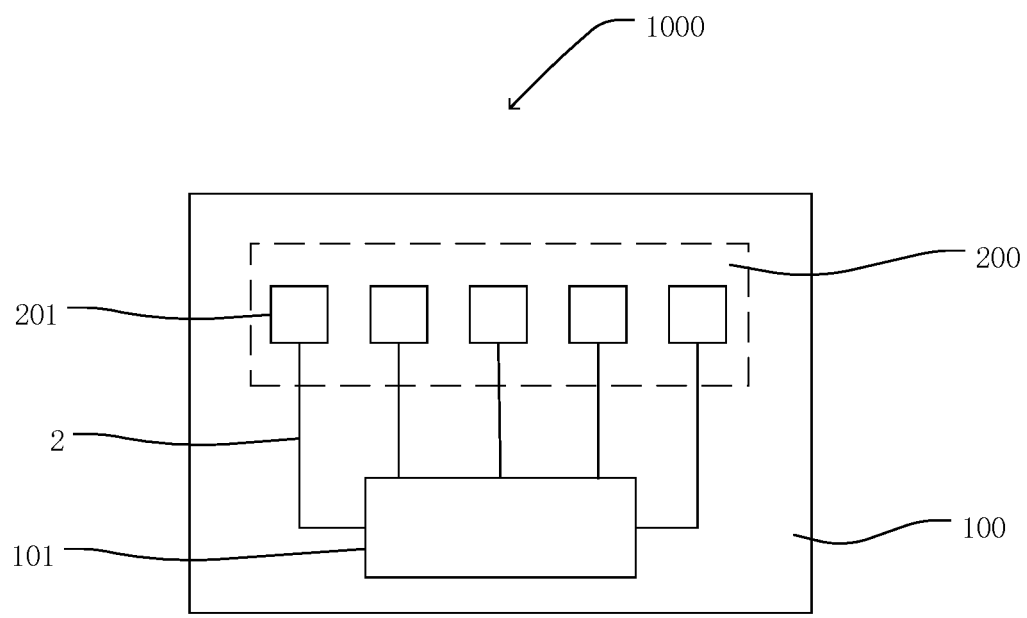
FIG. 1 is a schematic plan view of an array substrate according to an embodiment of the present invention.

The reference numerals of components in the figures are as follows: array substrate 1000; non-display area 100; driving circuit 101; display area 200; thin film transistor 201; polysilicon resistor 1; first tandem hole 11; second tandem hole 12; fanout wire 2; first scan wire 21; first connection end 211; second connection end 212; second scan wire 22; third connection end 221; fourth connection end 222; source circuit 3; drain circuit 4; buffer layer 5; first insulating layer 6; first through holes 61, 62, 63, 64; second insulating layer 7; second through hole 71, 72; interlayer dielectric layer 8; third through holes 81, 82, 83, 84.

DETAILED DESCRIPTION OF PREFERRED EMBODIMENTS

The technical solutions in the embodiments of the present invention will be clearly and completely described as follows with reference to the drawings in the embodiments of the present invention. Obviously, the described embodiments are a part of the embodiments in the invention, not all of them. Based on the embodiments of the present invention, all other embodiments obtained by those skilled in the field without doing any creative activity are within the claimed scope of the present invention.

In the drawings, components having the same structure are denoted by the same reference numerals. Components that are structurally or functionally similar are denoted by like reference numerals. The dimensions and thickness of each component shown in the drawings are arbitrarily shown, and the invention does not limit the size and thickness of each component. In order to make the illustration clearer, some parts of the drawings appropriately exaggerate the thickness of the components.

The directional terms used in the present invention, such as "upper", "lower", "left" and "right", etc., are merely directions in the drawings, and are merely used to explain the present invention, and are not intended to limit the scope of the present invention.

When a component is described as "on" another component, the component can be placed directly on another component, there may also be an intermediate component, the component is placed on the intermediate component and the intermediate component is placed on another component. When a component is described as "mounted to" or "connected to" another component, it can be understood to mean "mount to" or "connect to" directly, or a component is "mounted to" or "connected" to another component indirectly through an intermediate component.

As shown in FIG. 1, the embodiment provides an array substrate 1000 including a display area 200 and a non-display area 100. A plurality of thin film transistors 201 are disposed on the display area 200 and are arranged in an array on the display area 200, the thin film transistor 201 is provided with an input end. A driving circuit 101 is provided on the non-display area 100, the driving circuit 101 is provided with an output end. A non-display area 100 is further provided with a plurality of polysilicon resistors 1 and a plurality of fan-out wires 2, and both ends of each polysilicon resistor 1 are respectively connected to an input end of the thin film transistor 201 and an output end of the driving circuit 101 through the corresponding fan-out wires 2. The driving circuit 101 is used for transmitting a display signal, the thin film transistor 201 is used for receiving a signal, the fan-out wire 2 is used for transmitting a signal, and the polysilicon resistor is used for maintaining the resistance of each fan-out wires 2 consistent.

Figure 2:
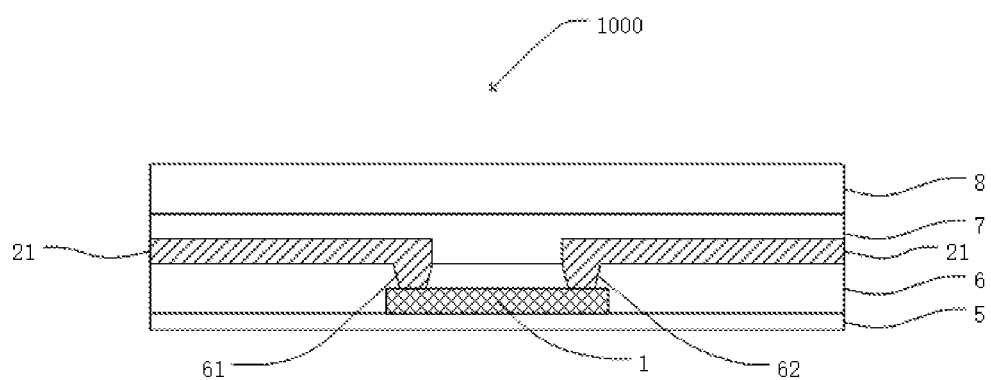
FIG. 2 is a schematic cross-sectional view showing a structure of the first scan wire in an embodiment of the present invention.
Figure 4:
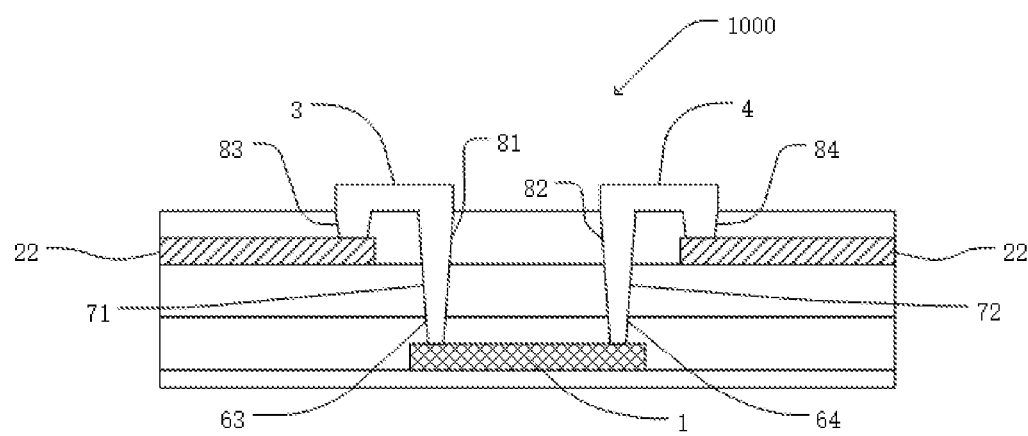
FIG. 4 is a schematic cross-sectional view showing a structure of the second scan wire in an embodiment of the present invention.

As shown in FIG. 2 and FIG. 4, the fan-out wire 2 in the embodiment includes a plurality of first scan wires 21 and a plurality of second scan wires 22 for transmitting signals sent by the driving circuit 101, while the first scan wire 21 is the gate of the thin film transistor, and the second scan wire 22 is used for the electrode end of the pixel circuit capacitor. The array substrate 1000 provided in the embodiment further includes a buffer layer 5, a first insulating layer 6, a second insulating layer 7, and an interlayer dielectric layer 8. A polysilicon resistor 1 is provided on the buffer layer 5. The buffer layer 5 may be made of silicon oxide for protecting the overall structure of the array substrate 1000 and reducing the damage of the array substrate 1000 during the preparation process. The first insulating layer 6 is disposed on the polysilicon resistor 1, the first scan wire 21 is disposed on the first insulating layer 6, the second insulating layer 7 overlies the first scan wire 21, and the second scan wire 22 is disposed on the second insulating layer 7. The first insulating layer 6 and the second insulating layer 7 are each made of an insulating material, such as tetrafluoroethylene plastic, for separating the wires of each layer to prevent the circuits from interacting with each other. The interlayer dielectric layer 8 overlies the second scan wire 22. The interlayer dielectric layer 8 employs a dielectric isolation technique, made of an insulating dielectric material, such as silicon dioxide, used to isolate important circuits.

A source circuit 3 and a drain circuit 4 are further disposed on the interlayer dielectric layer, the source circuit 3 is used to connect the source of the thin film transistor, and the drain circuit is used to connect the drain of the thin film transistor.

The first insulating layer 6 is provided with a plurality of first through holes. The second insulating layer 7 is provided with a plurality of second through holes. The interlayer dielectric layer 8 is provided with a plurality of third through holes. A total number of the first through holes and a total number of the third through holes each are twice as a total number of the second through holes.

Figure 3:
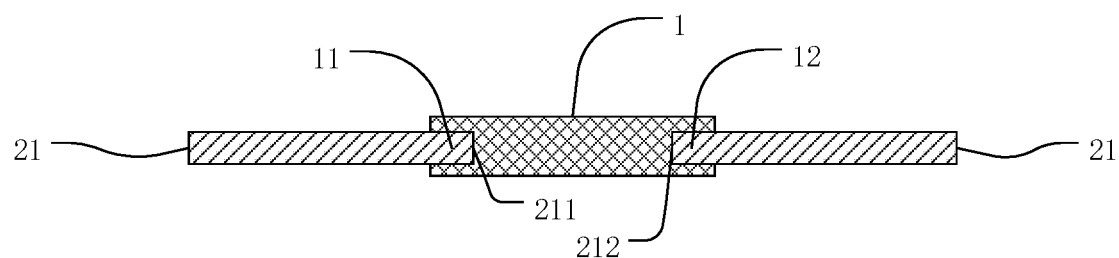
FIG. 3 is a schematic plan view showing a serial structure of the first scan wire in an embodiment of the present invention.
Figure 5:
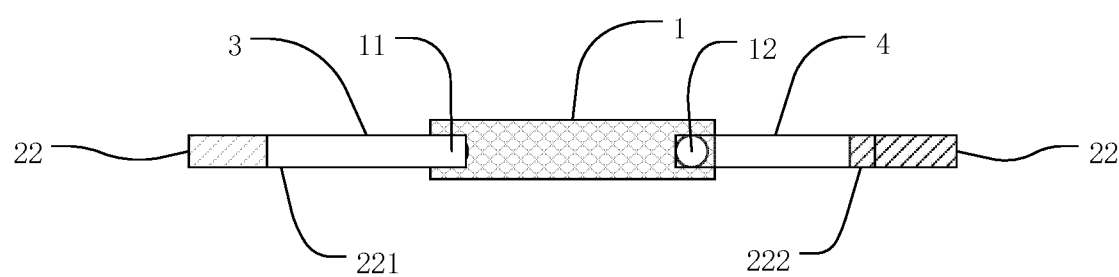
FIG. 5 is a schematic plan view showing a serial structure of the second scan wire in an embodiment of the present invention.

As shown in FIG. 3 and FIG. 5, each of the polysilicon resistors 1 is provided with a first tandem hole 11 and a second tandem hole 12 at both ends of the polysilicon resistor 1. Each of the first scan wires 21 is provided with a first connection end 211 and a second connection end 212. Each of the second scan wires 22 is provided with a third connection end 221 and a fourth connection end 222.

The first connection end 211 of the first scan wire 21 is connected to the first tandem hole 11 of the polysilicon resistor 1 through the corresponding first through hole 61. The second connection end 212 is connected to the second tandem hole 12 of the polysilicon resistor 1 through the corresponding first through hole 62. In this way, the serial connection of each of the first scan wires 21 and the corresponding polysilicon resistor 1 is achieved.

One end of the source circuit 3 is connected to the third connection end 221 of the corresponding second scan wire 22 through the third through hole 83, the other end is connected to the first tandem hole 11 of the corresponding polysilicon resistor 1 through the third through hole 81, the second through hole 71, and the first through hole 63 in sequence. One end of the drain circuit 4 is connected to the fourth connection end 222 of the corresponding second scan wire 22 through the third through hole 84, the other end is connected to the second tandem hole 12 of the corresponding polysilicon resistor 1 through the third through hole 82, the second through hole 72, and the first through hole 64 in sequence. The second scan wire 22 achieves a series connection with the corresponding polysilicon resistor 1 in this way while also controlling the current between the source and drain.

Each of the fanout wires 2 in the embodiment is a straight wire.

The embodiment further provides a display device (not shown) including the array substrate described above.

Each of the fan-out wires in the embodiment is connected in series with a corresponding polysilicon resistor. The resistance of each wire can be kept substantially consistent by changing the size and length of the polysilicon resistor. This method greatly simplifies the wire structure, eliminates the structure of a large number of curved windings in the prior art, thereby avoiding the breakage of the interlayer dielectric layer, and avoiding the short circuit of the second scan wire and source and drain caused by the breakage. It not only saves the raw materials for the wires, reduces the cost, but also improves the service life of the product.

The description of the above exemplary embodiments is only for the purpose of understanding the invention. It is to be understood that the present invention is not limited to the disclosed exemplary embodiments. It is obvious to those skilled in the art that the above exemplary embodiments may be modified without departing from the scope and spirit of the present invention.

What is claimed is:

1. An array substrate provided with a display area and a non-display area and comprising:
    a plurality of thin film transistors arranged in an array on the display area, each thin film transistor comprising a source circuit and a drain circuit;
    a driving circuit corresponding to the non-display area;
    a plurality of polysilicon resistors and a plurality of fan-out wires corresponding to the non-display area, the plurality of fan-out wires comprising a plurality of first scan wires and a plurality of second scan wires, each first scan wire having a first connection end and a second connection end, and each second scan wire having a third connection end and a fourth connection end;
    wherein two ends of each polysilicon resistor are respectively connected to an input end of the thin film transistor and an output end of the driving circuit via corresponding fan-out wires, and one of the two ends of each polysilicon resistor is provided with a first tandem hole, another one of the two ends of each polysilicon resistor is provided with a second tandem hole; and
    wherein when one of the plurality of polysilicon resistors is connected to a corresponding first scan wire, the first tandem hole is connected to the first connection end, and the second tandem hole is connected to the second connection end, and when one of the plurality of polysilicon resistors is connected to a corresponding second scan wire, the first tandem hole is connected to the third connection end through the source circuit, and the second tandem hole is connected to the fourth connection end through the drain circuit.

2. A display device comprising the array substrate according to claim 1.

3. The array substrate according to claim 1, further comprising:
    a buffer layer, the polysilicon resistors being disposed on the buffer layer;
    a first insulating layer covering the plurality of polysilicon resistors, the plurality of first scan wires being disposed on the first insulating layer;
    a second insulating layer covering the plurality of first scan wires, the plurality of second scan wires being disposed on the second insulating layer; and
    an interlayer dielectric layer covering the plurality of second scan wires.

4. The array substrate according to claim 3, wherein a material of the interlayer dielectric layer is an insulating dielectric material.

5. The array substrate according to claim 3, wherein the source circuit and the drain circuit are disposed on the interlayer dielectric layer.

6. The array substrate according to claim 3, wherein the first insulating layer is provided with a plurality of first through holes extending through the first insulating layer, and each first through holes corresponds to the first tandem hole or the second tandem hole in respect to a vertical direction.

7. The array substrate according to claim 6, wherein the second insulating layer is provided with a plurality of second through holes to extending through the second insulating layer, and each second through holes corresponds to the first tandem hole or the second tandem hole in respect to the vertical direction.

8. The array substrate according to claim 7, wherein the interlayer dielectric layer is provided with a plurality of third through holes extending through the interlay dielectric layer, and each third through hole corresponds to one of the plurality of second through holes or the third connection end or the fourth connection end in respect to the vertical direction.

9. The array substrate according to claim 8, wherein a total number of the plurality of first through holes and a total number of the plurality of third through holes each are twice as a total number of the plurality of second through holes.

* * * * *